(12) United States Patent
Pu et al.

(10) Patent No.: US 11,829,541 B2
(45) Date of Patent: Nov. 28, 2023

(54) DISPLAY PANEL AND MANUFACTURING METHOD THEREOF, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Shimin Pu, Beijing (CN); Jianjun Wu, Beijing (CN); Jiangsheng Wang, Beijing (CN); Chang Zhang, Beijing (CN); Qi Liu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 54 days.

(21) Appl. No.: 17/631,482

(22) PCT Filed: Mar. 11, 2021

(86) PCT No.: PCT/CN2021/080166
§ 371 (c)(1),
(2) Date: Jan. 30, 2022

(87) PCT Pub. No.: WO2021/218428
PCT Pub. Date: Nov. 4, 2021

(65) Prior Publication Data
US 2022/0276735 A1 Sep. 1, 2022

(30) Foreign Application Priority Data
Apr. 29, 2020 (CN) .......................... 202010359499.0

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *G06F 3/0445* (2019.05);
(Continued)

(58) Field of Classification Search
CPC ...... G06F 3/041–047; G06F 2203/041–04114; H10K 59/87;
(Continued)

(56) References Cited

U.S. PATENT DOCUMENTS

2016/0170524 A1* 6/2016 Kim ...................... G06F 3/0446
345/174
2017/0277320 A1 9/2017 Choi et al.
(Continued)

FOREIGN PATENT DOCUMENTS

CN 108415604 A 8/2018
CN 109240528 A 1/2019
(Continued)

OTHER PUBLICATIONS

China Patent Office, CN202010359499.0 First Office Action dated Aug. 9, 2022.

*Primary Examiner* — Sanjiv D. Patel
(74) *Attorney, Agent, or Firm* — HOUTTEMAN LAW LLC

(57) ABSTRACT

A display panel and a manufacturing method thereof, and a display device are provided. The display panel includes: a substrate; a plurality of light-emitting elements and an encapsulation layer disposed on the substrate, with the plurality of light-emitting elements located between the encapsulation layer and the substrate; a transfer layer disposed on a side of the encapsulation layer away from the substrate and bonded to the encapsulation layer, with an adhesive force between the transfer layer and the encapsulation layer greater than that between an organic adhesive
(Continued)

layer and the encapsulation layer, and the organic adhesive layer configured to react chemically under a preset catalytic condition to be formed to the transfer layer; and a touch structure (40) disposed on a side of the transfer layer away from the substrate and configured to detect occurrence of a touch action.

14 Claims, 10 Drawing Sheets

(51) Int. Cl.
*H10K 59/122* (2023.01)
*H10K 59/12* (2023.01)

(52) U.S. Cl.
CPC ........ *G06F 3/0446* (2019.05); *G06F 3/04164* (2019.05); *H10K 59/122* (2023.02); *G06F 2203/04103* (2013.01); *G06F 2203/04107* (2013.01); *G06F 2203/04111* (2013.01); *H10K 59/1201* (2023.02)

(58) Field of Classification Search
CPC ............. H10K 59/8731; H10K 59/873; H10K 50/844; H10K 71/00; H10K 50/8426; H10K 59/131; H10K 59/12; H10K 59/122; H10K 59/124; H10K 59/84
See application file for complete search history.

(56) References Cited

U.S. PATENT DOCUMENTS

| | | | |
|---|---|---|---|
| 2019/0095007 A1* | 3/2019 | Jeong | G06F 1/1643 |
| 2020/0133415 A1* | 4/2020 | Choi | G06F 3/0412 |
| 2020/0333907 A1* | 10/2020 | Luo | H10K 71/18 |

FOREIGN PATENT DOCUMENTS

| | | |
|---|---|---|
| CN | 109545838 A | 3/2019 |
| CN | 111477666 A | 7/2020 |

* cited by examiner

DISPLAY PANEL AND MANUFACTURING METHOD THEREOF, AND DISPLAY DEVICE

CROSS-REFERENCE TO RELATED APPLICATION

This is a National Phase Application filed under 35 U.S.C. 371 as a national stage of PCT/CN2021/080166, filed on Mar. 11, 2021, an application claiming the benefit of the Chinese patent application No. 202010359499.0 filed on Apr. 29, 2020 and entitled "DISPLAY PANEL AND MANUFACTURING METHOD THEREOF, AND DISPLAY DEVICE", the content of each of which is hereby incorporated by reference in its entirety.

TECHNICAL FIELD

The present disclosure relates to the field of display technology, and in particular, to a display panel and a manufacturing method thereof, and a display device.

BACKGROUND

With the development of organic light emitting diode (OLED) display technology, OLED display devices have been widely used. In order to meet requirements of users on product thickness and touch experience, in a manufacturing process, a touch function layer is disposed on an encapsulation layer of an OLED display panel.

SUMMARY

The embodiments of the present disclosure provide a display panel and a manufacturing method thereof, and a display device.

According to a first aspect of the present disclosure, there is provided a display panel, including:

a substrate;

a plurality of light-emitting elements and an encapsulation layer disposed on the substrate, with the plurality of light-emitting elements located between the encapsulation layer and the substrate;

a transfer layer disposed on a side of the encapsulation layer away from the substrate and bonded to the encapsulation layer, with an adhesive force between the transfer layer and the encapsulation layer greater than that between an organic adhesive layer and the encapsulation layer, and the organic adhesive layer configured to react chemically under a preset catalytic condition to be formed to the transfer layer; and a touch structure disposed on a side of the transfer layer away from the substrate and configured to detect occurrence of a touch action.

In some embodiments, the display panel further includes: an insulating separation layer disposed on the side of the transfer layer away from the substrate, the insulating separation layer has a density greater than that of the transfer layer, an orthographic projection of the insulating separation layer on the substrate coincides with that of the transfer layer on the substrate, and the touch structure is disposed on a side of the insulating separation layer away from the transfer layer.

In some embodiments, the insulating separation layer includes a lamination of one or more of a nitride layer of silicon, an oxide layer of silicon, and an oxynitride layer of silicon.

In some embodiments, the preset catalytic condition is an ultraviolet curing condition or a moisture curing condition.

In some embodiments, the substrate includes a display area and a peripheral area surrounding the display area, the peripheral area includes a pad area located on a side of the display area, and the touch structure includes:

a pad located in the pad area;

a touch electrode pattern; and a touch signal line located in the peripheral area, with one end of the touch signal line coupled to the touch electrode pattern, and the other end of the touch signal line coupled to the pad.

In some embodiments, the touch structure further includes a touch insulating layer, the touch electrode pattern includes a plurality of touch driving electrodes and a plurality of touch sensing electrodes, the touch driving electrodes and the touch sensing electrodes are arranged crosswise, a position where the touch driving electrodes cross the touch sensing electrodes is insulated and separated by the touch insulating layer, and each touch driving electrode and each touch sensing electrode are correspondingly coupled to at least one touch signal line.

In some embodiments, the touch driving electrodes and the touch sensing electrodes are located in different layers.

In some embodiments, the touch driving electrode includes: a plurality of driving electrode units arranged in a first direction, and a bridge portion coupled between each two adjacent ones of the driving electrode units;

the touch sensing electrode includes a plurality of sensing electrode units arranged in a second direction, and a connection portion coupled between each two adjacent ones of the sensing electrode units; and the first direction intersects the second direction, all of the driving electrode units, the bridge portion and the sensing electrode units are located on a side of the touch insulating layer away from the substrate and are arranged on a same layer, and the connection portion is located between the touch insulating layer and the encapsulation layer.

In some embodiments, the touch structure further includes: a first ground line and a second ground line located in the peripheral area, one end of the first ground line is coupled to a corresponding pad in the pad area, and the other end of the first ground line extends to a side of the display area away from the pad area;

one end of the second ground line is coupled to a corresponding pad in the pad area, and the other end of the second ground line extends to the side of the display area away from the pad area; and the first ground line and the second ground line form a semi-enclosed structure surrounding the display area, and each touch signal line is located between the first ground line and the second ground line.

In some embodiments, both the pad coupled to the first ground line and the pad coupled to the second ground line are configured to load a ground signal.

In some embodiments, the first ground line includes a first ground portion, the second ground line includes a second ground portion, both the first ground portion and the second ground portion are located on the side of the display area away from the pad area, the first ground portion is not in contact with the second ground portion, and the first ground portion overlaps the second ground portion in a first direction that is a direction from the pad area to the display area.

In some embodiments, the touch structure further includes: a first guard line and a second guard line, one end of the first guard line is coupled to a corresponding pad in the pad area, and the other end of the first guard line extends to the side of the display area away from the pad area;

one end of the second guard line is coupled to a corresponding pad in the pad area, and the other end of the second guard line extends to the side of the display area away from the pad area; and the first guard line and the second guard line form a semi-enclosed structure surrounding the display area, the first guard line is located between a touch signal line closest to the first ground line and the first ground line, and the second guard line is located between a touch signal line closest to the second ground line and the second ground line.

In some embodiments, both the pad coupled to the first guard line and the pad coupled to the second guard line are configured to load an alternating current signal.

In some embodiments, the first guard line includes a first guard portion, the second guard line includes a second guard portion, both the first guard portion and the second guard portion are located on the side of the display area away from the pad area, the first guard portion is not in contact with the second guard portion, and the first guard portion does not overlap the second guard portion in a first direction that is a direction from the pad area to the display area.

In some embodiments, the display panel further includes:
a buffer layer disposed on the substrate;
a semiconductor layer disposed on a side of the buffer layer away from the substrate;
a first gate insulating layer disposed on a side of the semiconductor layer away from the substrate;
a first gate electrode layer disposed on a side of the first gate insulating layer away from the substrate;
a second gate insulating layer disposed on a side of the first gate electrode layer away from the substrate;
a second gate electrode layer disposed on a side of the second gate insulating layer away from the substrate;
an interlayer insulating layer disposed on a side of the second gate electrode layer away from the substrate;
a first source/drain conductive layer disposed on a side of the interlayer insulating layer away from the substrate;
a passivation layer disposed on a side of the first source/drain conductive layer away from the substrate;
a first planarization layer disposed on a side of the passivation layer away from the substrate;
a second source/drain conductive layer disposed on a side of the first planarization layer away from the substrate;
a second planarization layer disposed on a side of the second source/drain conductive layer away from the substrate; and
a pixel defining layer disposed on a side of the second planarization layer away from the substrate and including pixel openings in one-to-one correspondence with the light-emitting elements; and each of the plurality of light-emitting elements includes: a first electrode, a light-emitting layer and a second electrode, the first electrode is located between the second planarization layer and the pixel defining layer, the light-emitting layer is located on a side of the first electrode away from the substrate, the light-emitting layer is disposed in a corresponding pixel opening, the second electrode is located on a side of the light-emitting layer away from the substrate, and the second electrodes of the plurality of light-emitting elements are coupled as a whole to form a second electrode layer.

In a second aspect, an embodiment of the present disclosure provides a method for manufacturing a display panel, including:
forming a plurality of light-emitting elements on a substrate;
forming an encapsulation layer on a side of the plurality of light-emitting elements away from the substrate;
forming an organic adhesive layer on a bearing plate;
forming a touch structure on a side of the organic adhesive layer away from the bearing plate, the touch structure being configured to detect occurrence of a touch action;
separating the organic adhesive layer from the bearing plate, and transferring the organic adhesive layer and the touch structure onto the encapsulation layer; and
applying a preset catalytic condition to the organic adhesive layer, such that the organic adhesive layer reacts chemically to enhance adhesion and thus to be formed to a transfer layer, an adhesive force between the transfer layer and the encapsulation layer being greater than that between the organic adhesive layer and the encapsulation layer.

In some embodiments, between the forming the organic adhesive layer on the bearing plate and the forming the touch structure on the side of the organic adhesive layer away from the bearing plate, the method further includes:
forming an insulating separation layer, the insulating separation layer having a density greater than that of the organic adhesive layer, and a portion of the insulating separation layer extending beyond a boundary of the organic adhesive layer, such that the portion of the insulating separation layer extending beyond the boundary of the organic adhesive layer is coupled to the bearing plate; and
between the forming the touch structure on the side of the organic adhesive layer away from the bearing plate and the separating the organic adhesive layer from the bearing plate, the method further includes:
removing at least the portion of the insulating separation layer extending beyond the boundary of the organic adhesive layer.

In some embodiments, the removing at least the part of the insulating separation layer extending beyond the boundary of the organic adhesive layer includes:
cutting the insulating separation layer and the organic adhesive layer along a preset cutting line, with the preset cutting line located on a side of the boundary of the organic adhesive layer close to a center of the organic adhesive layer.

In a third aspect, an embodiment of the present disclosure further provides a display device, including the above display panel.

BRIEF DESCRIPTION OF DRAWINGS

The drawings are used to provide a further understanding of the present disclosure, constitute a part of specification, and explain the present disclosure with the following specific embodiments, but do not constitute a limitation on the present disclosure. In the drawings.

DETAIL DESCRIPTION OF EMBODIMENTS

The specific embodiments of the present disclosure are described in detail below with reference to the drawings. It should be understood that the specific embodiments described herein are merely used to illustrate and explain the present disclosure, and are not intended to limit the present disclosure.

To make the objectives, technical solutions and advantages of the embodiments of the present disclosure clearer, the technical solutions of the embodiments of the present disclosure are described clearly and completely below with reference to the drawings of the embodiments of the present disclosure. It is obvious that the embodiments described herein are some embodiments of the present disclosure, and not all of the embodiments. All other embodiments, which are obtained by those skilled in the art based on the described embodiments of the present disclosure without inventive work, are within the protection scope of the present disclosure.

The terms herein used for describing the embodiments of the present disclosure are not intended to restrict and/or limit the scope of the present disclosure. For example, unless otherwise defined, the technical terms or scientific terms used in the present disclosure should have general meanings that can be understood by those of ordinary skill in the art. It should be understood that the words "first", "second" and the like used in the present disclosure do not denote any order, quantity, or importance, and are merely used to distinguish between different elements. Unless indicated clearly in the context otherwise, the singular form "a", "an", "the" or the like does not denote limitation of quantity, but denote "at least one". The word "include", "comprise" or the like indicates that an element or object before the word covers elements, objects or the equivalents thereof listed after the word, but do not exclude other elements or objects. The word "connect", "couple" or the like is not restricted to physical or mechanical connection, and may include electrical connection, whether direct or indirect. The words "on", "under", "left", "right" and the like are merely used to indicate relative positional relationships, and when an absolute position of a described object is changed, the relative positional relationships may be changed accordingly.

In the following description, when an element or layer is referred to as being "on" or "connected to" another element or layer, the element or layer may be directly on or connected to another element or layer, or there may be intermediate elements or layers therebetween. However, when an element or layer is referred to as being "directly on" or "directly connected to" another element or layer, there is no intermediate element or layer therebetween. The term "and/or" includes one or more of any and all combinations of related listed items.

Figure 1:
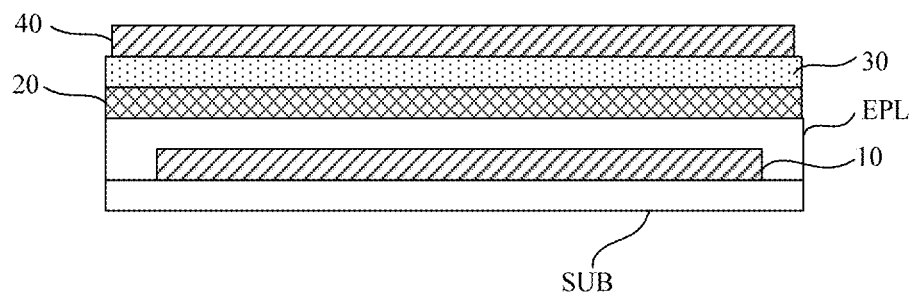
FIG. 1 is a schematic structural diagram of a display panel according to some embodiments of the present disclosure.

FIG. 1 is a schematic structural diagram of a display panel according to some embodiments of the present disclosure. As shown in FIG. 1, the display panel includes a substrate SUB, a light-emitting structure layer 10, an encapsulation layer EPL, a transfer layer 20, and a touch structure 40, the light-emitting structure layer 10 includes a plurality of light-emitting elements, the plurality of light-emitting elements and the encapsulation layer EPL are disposed on the substrate SUB, and the plurality of light-emitting elements are located between the encapsulation layer EPL and the substrate SUB. The Light-emitting elements may be OLEDs, which may emit, for example, red light, green light, blue light, or white light. The encapsulation layer EPL is configured to encapsulate the light-emitting elements to prevent vapor and/or oxygen in external environment from eroding the light-emitting elements.

The transfer layer 20 is disposed on a side of the encapsulation layer EPL away from the substrate SUB and is bonded to the encapsulation layer EPL, and the transfer layer 20 is a film formed by a chemical reaction of an organic adhesive layer on the encapsulation layer EPL under a preset catalytic condition. The transfer layer 20 has great adhesion, and an adhesive force between the transfer layer 20 and the encapsulation layer EPL is greater than that between the organic adhesive layer and the encapsulation layer EPL. That is, the organic adhesive layer is configured to react chemically under the preset catalytic condition to be formed to the transfer layer 20. Under a condition that the preset catalytic condition is not applied, there is no adhesive force between the organic adhesive layer and the encapsulation layer EPL, or there is a relatively small adhesive force therebetween; and after the preset catalytic condition is applied, the organic adhesive layer reacts chemically to have an increased adhesion, and thus the adhesive force between the organic adhesive layer (i.e., the transfer layer 20) subjected to the chemical reaction and the encapsulation layer EPL is increased. For example, the organic adhesive layer is an incompletely cured organic composite film, and the organic adhesive layer is further cured under the preset catalytic condition to be formed to be the transfer layer 20.

The touch structure 40 is disposed on a side of the transfer layer 20 away from the substrate SUB and is configured to detect occurrence of a touch action. For example, the touch structure 40 includes a touch electrode pattern and a touch signal line, the touch electrode pattern receives a touch driving signal and generates a touch sensing signal according to the touch action. For example, the touch structure 40 is configured to detect a touch position, touch force, and the like.

In a process of forming the touch electrode pattern and the touch signal line, a conductive material needs to be etched to form a required pattern. When the touch structure 40 is directly formed on the encapsulation layer EPL, damage is easily caused to the encapsulation layer EPL and each structure between the encapsulation layer EPL and the substrate SUB during the etching process. Moreover, when the touch electrode pattern is made of a transparent conductive material such as Indium Tin Oxide (ITO), the Indium Tin Oxide needs to be subjected to high-temperature annealing to reduce a resistance of the touch electrode pattern. When the Indium Tin Oxide is subjected to the high-temperature annealing, damage is also easily caused to the encapsulation layer EPL and each structure between the encapsulation layer EPL and the substrate SUB.

In the embodiment of the present disclosure, the touch structure 40 is disposed on the side of the transfer layer 20 away from the substrate SUB, and the transfer layer 20 is formed by the chemical reaction of the organic adhesive layer on the encapsulation layer EPL under the preset catalytic condition, and the adhesive force between the transfer layer 20 and the encapsulation layer EPL is greater than that between the organic adhesive layer and the encapsulation layer EPL. Therefore, in a process of manufacturing the display panel, first an organic adhesive layer with relatively small adhesion may be formed on a bearing plate, next the touch structure 40 is formed on the organic adhesive layer, and then the organic adhesive layer and the touch structure 40 are transferred onto the encapsulation layer EPL, and the preset catalytic condition is applied to the organic adhesive layer, so that the organic adhesive layer is formed into the transfer layer 20 tightly connected to the encapsulation layer EPL. In this case, when the touch structure 40 is manufactured, the etching process or the high-temperature annealing process of the touch structure 40 does not cause damage to the encapsulation layer EPL and film layers between the encapsulation layer EPL and the substrate SUB, thereby facilitating the improvement of product yield of the display panel.

In some embodiments, the preset catalytic condition includes a photo-curing (e.g., ultraviolet curing) condition or a moisture curing condition.

In some embodiments, as shown in FIG. 1, the display panel further includes an insulating separation layer 30 which has a density greater than that of the transfer layer 20, an orthographic projection of the insulating separation layer 30 on the substrate SUB coincides with that of the transfer layer 20 on the substrate SUB, and the touch structure 40 is disposed on a side of the insulating separation layer 30 away from the transfer layer 20. In the process of manufacturing the display panel, after the organic adhesive layer is formed on the bearing plate, an insulating separation layer 30 with a relatively high density may be further formed, and a portion of the insulating separation layer 30 may extend beyond a boundary of the organic adhesive layer, so that the portion of the insulating separation layer 30 extending beyond the boundary of the organic adhesive layer may be firmly connected to the bearing plate, and thus the organic adhesive layer is fixed on the bearing plate. When the organic adhesive layer is transferred onto the encapsulation layer, at least the portion of the insulating separation layer 30 extending beyond the boundary of the organic adhesive layer is removed, so as to separate the organic adhesive layer from the bearing plate.

It should be noted that FIG. 1 simply illustrates the positional relationships among the substrate SUB, the light-emitting structure layer 10 (i.e., the plurality of light-emitting elements), the encapsulation layer EPL, the transfer layer 20, the insulating separation layer 30, and the touch structure 40, while the substrate SUB is not in direct contact with the light-emitting elements, and other film layer are formed therebetween, which are described in detail below.

Figure 2:
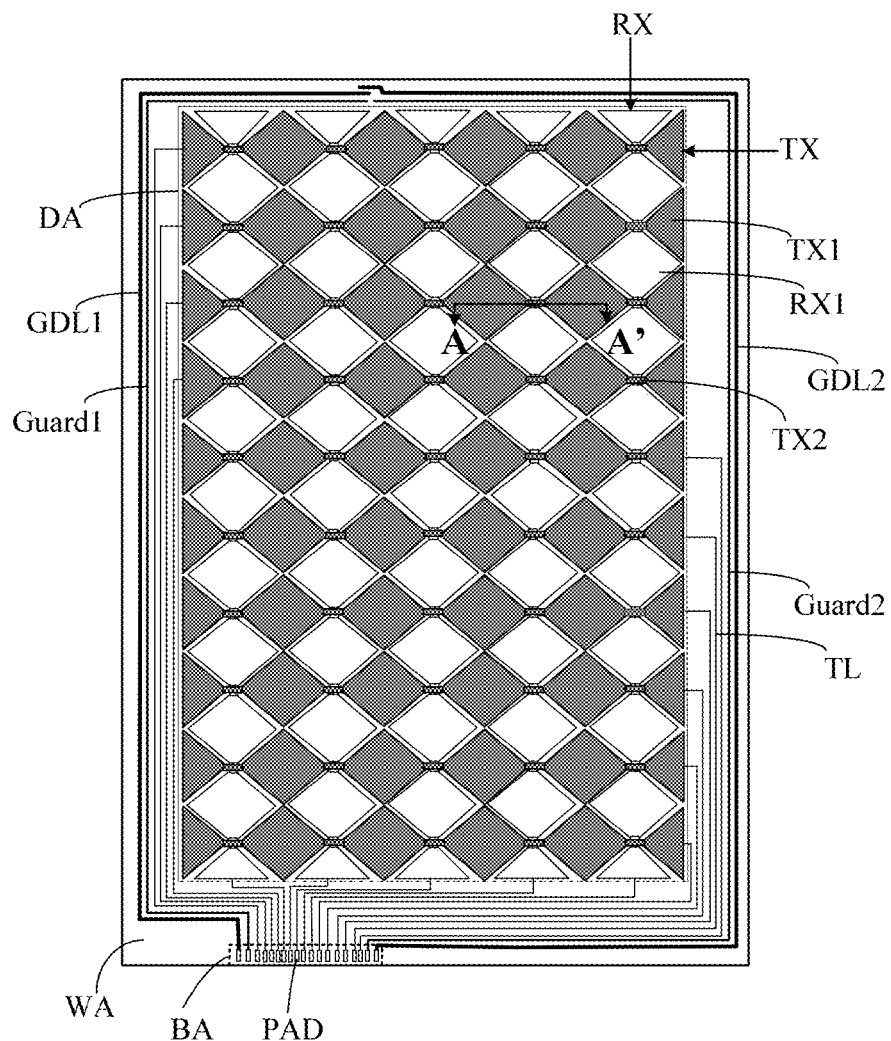
FIG. 2 is a plan view of a display panel according to some embodiments of the present disclosure.
Figure 3:
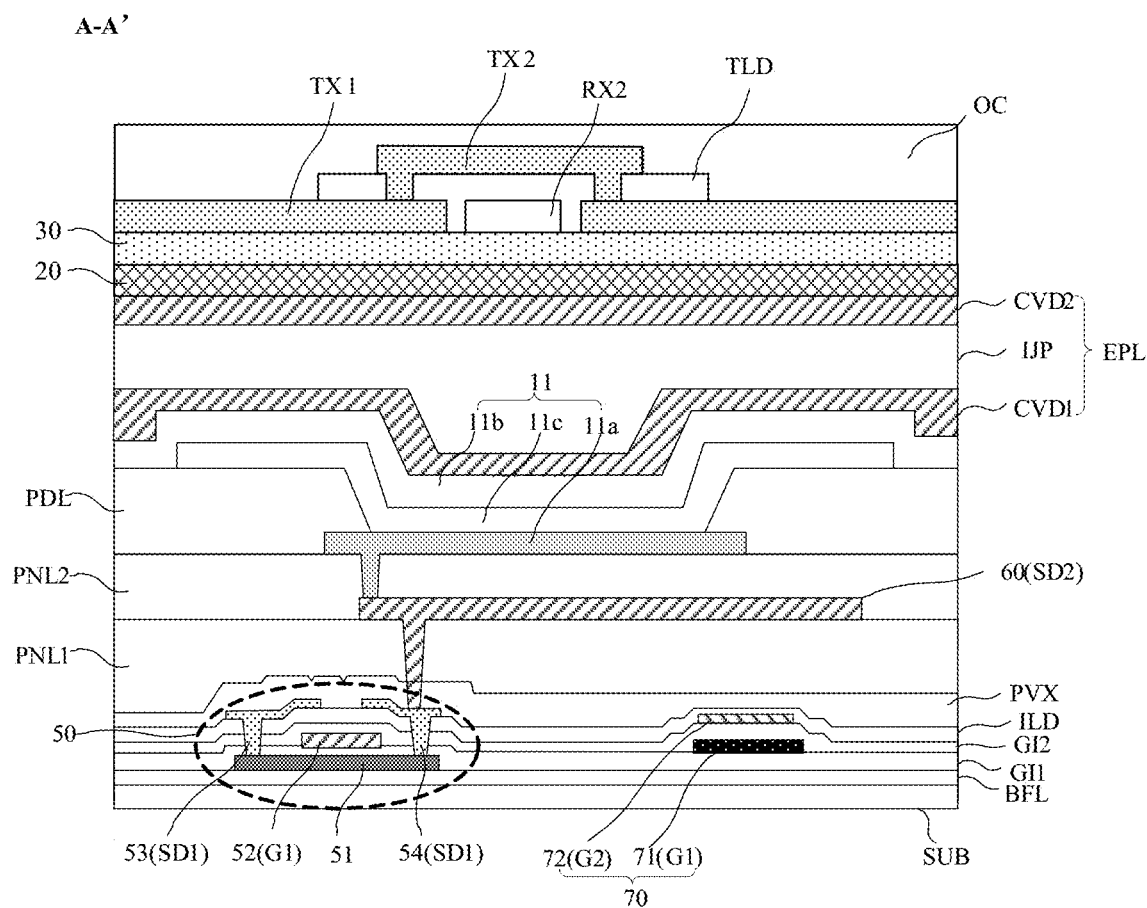
FIG. 3 is a sectional view taken along line AA' in FIG. 2.
Figure 4:
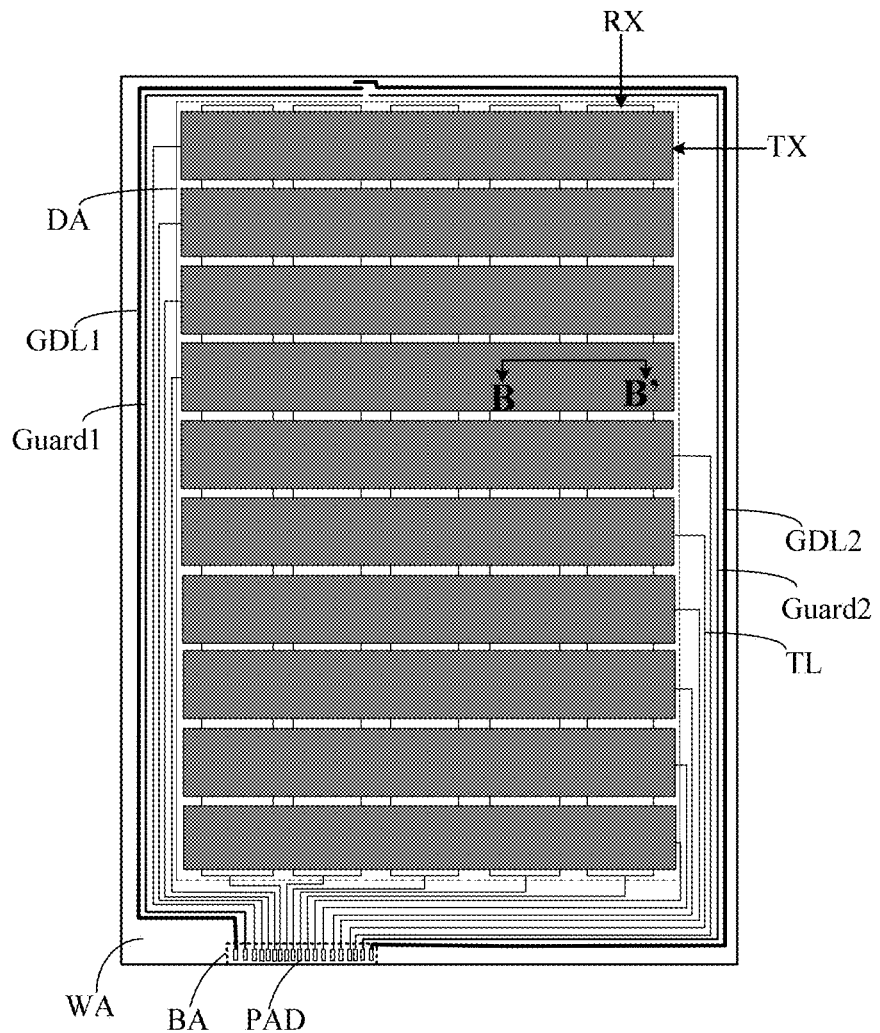
FIG. 4 is a plan view of a display panel according to other embodiments of the present disclosure.
Figure 5:
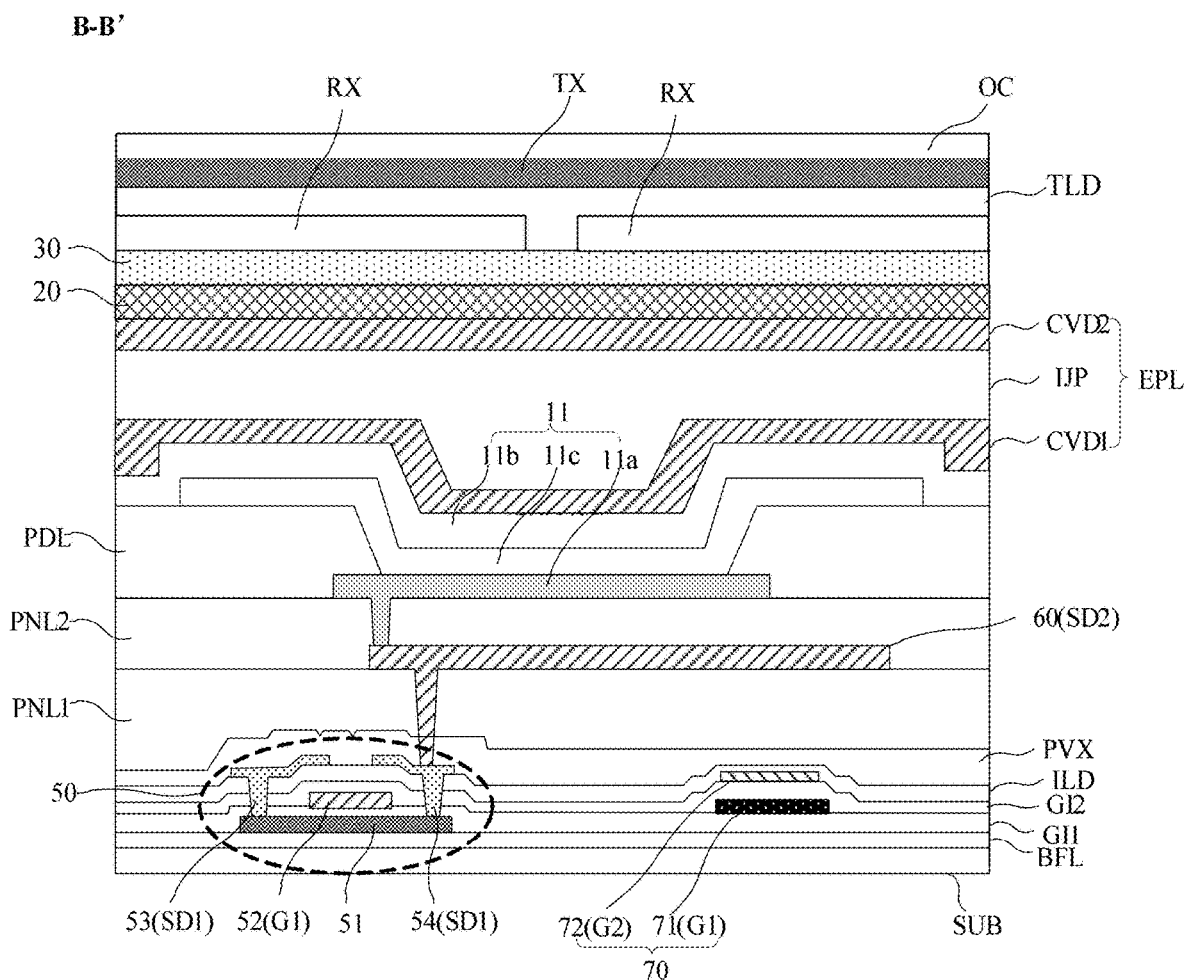
FIG. 5 is a sectional view taken along line BB' in FIG. 4.

FIG. 2 is a plan view of a display panel according to some embodiments of the present disclosure, FIG. 3 is a sectional view taken along line AA' in FIG. 2, FIG. 4 is a plan view of a display panel according to other embodiments of the present disclosure, and FIG. 5 is a sectional view taken along line BB' in FIG. 4. The display panel in the embodiment of the present disclosure is described below with reference to FIG. 2 to FIG. 5.

In some embodiments, the substrate SUB includes a display area DA and a peripheral area WA surrounding the display area DA, the peripheral area WA includes a pad area BA located on a side of the display area DA, and the touch structure 40 includes: a pad PAD, a touch electrode pattern (such as a touch driving electrode TX and a touch sensing electrode RX in FIG. 2 and FIG. 4), and a touch signal line TL. The pad PAD is located in the pad area BA, the touch electrode pattern is substantially located in the display area DA, and the touch signal line TL is located in the peripheral area WA. One end of the touch signal line TL is connected to the touch electrode pattern, and the other end of the touch signal line TL is connected to the pad PAD.

The pad PAD is not covered by any layer, thereby facilitating the electric connection thereof to a flexible printed circuit board (FPCB). The FPCB is electrically connected to a touch driving chip and configured to transmit a signal from the touch driving chip. The touch signal line TL is electrically connected to the pad PAD and the touch electrode pattern, thereby realizing signal transmission between the touch electrode pattern and the FPCB.

The touch electrode pattern may use a mutual capacitance type structure or a self-capacitance type structure. The embodiment of the present disclosure is described by taking the mutual capacitance type structure as an example.

As shown in FIG. 3 and FIG. 5, the touch structure 40 further includes a touch insulating layer TLD, and a material of the touch insulating layer TLD may include an inorganic material such as silicon oxide (SiOx), silicon nitride (SiNx), and/or silicon oxynitride (SiON), and may be formed as multiple layers or a single layer. It should be noted that the touch insulating layer TLD may also be made of an organic material.

The touch electrode pattern includes a plurality of touch driving electrodes TX and a plurality of touch sensing electrodes RX. The touch driving electrodes TX and the touch sensing electrodes RX are arranged crosswise, a position where the touch driving electrodes TX cross the touch sensing electrodes RX is insulated and separated by the touch insulating layer TLD, and each touch driving electrode TX and each touch sensing electrode RX are correspondingly connected to at least one touch signal line TL.

A touch capacitance is formed at the position where the touch driving electrode TX crosses the touch sensing electrode RX. When touch sensing is carried out, the touch driving chip sequentially supplies the touch driving signals to the pads PAD corresponding to the plurality of touch driving electrodes TX, so that the touch driving signals are sequentially applied to respective touch driving electrodes TX, and the corresponding sensing signals are generated on the touch sensing electrodes RX. When a touch occurs, like a human body or a touch pen approaches the touch area, the touch capacitance in the area changes, then the sensing signal of the touch sensing electrode RX at the corresponding position changes, and thus the touch driving chip determines the touch position according to the changed sensing signal.

In some embodiments, as shown in FIG. 5, the touch driving electrodes TX and the touch sensing electrodes RX are located in different layers. For example, both the touch driving electrodes TX and the touch sensing electrodes RX are strip electrodes, and the touch insulating layer at least covers the display area.

For example, both the touch driving electrode TX and the touch sensing electrode RX are transparent electrodes; or both the touch driving electrode TX and the touch sensing electrode RX are metal mesh electrodes; or, one of the touch driving electrode TX and the touch sensing electrode RX is a transparent electrode, and the other is a metal mesh electrode. In some embodiments, the transparent electrode is made of a transparent conductive material such as Indium Tin Oxide (ITO), and the metal mesh electrode is a mesh metal made of a metal material such as aluminum or copper.

In other embodiments, as shown in FIG. 2 and FIG. 3, the touch driving electrode TX includes: a plurality of driving electrode units TX1 arranged in a first direction, and a bridge portion TX2 connected between each two adjacent driving electrode units TX1. The touch sensing electrode RX includes: a plurality of sensing electrode units RX1 arranged in a second direction, and a connection portion RX2 connected between each two adjacent sensing electrode units RX1. The first direction intersects the second direction, both the driving electrode units TX and the touch sensing electrode RX are located between the touch insulating layer TLD and the encapsulation layer EPL and are in the same layer, and the bridge portion TX2 is located between the touch insulating layer TLD and the encapsulation layer EPL. For example, the first direction is a left-right direction in FIG. 2, and the second direction is an up-down direction in FIG. 2. It should be noted that the touch driving electrode TX and the touch sensing electrode RX shown in FIG. 2 and FIG. 3 are only exemplary and are not intended to limit the present disclosure. For example, the connection portion RX2 may be located on a side of the touch insulating layer TLD away from the substrate SUB, and the bridge portion TX2 may be located on a side of the touch insulating layer TLD close to the substrate SUB. For another example, the adjacent driving electrode units TX1 are connected by the connection portions RX2 arranged in different layers, and the adjacent sensing electrode units RX1 are connected by the bridge portions TX2 arranged in the same layer.

For example, both the driving electrode unit TX1 and the sensing electrode unit RX1 are transparent electrodes, or both the driving electrode unit TX1 and the sensing electrode unit RX1 are metal mesh electrodes. The bridge portion TX2 is made of a material same as that of the driving electrode unit TX1, and the connection portion RX2 may be made of a metal material.

In some embodiments, as shown in FIG. 2 and FIG. 4, the touch structure 40 further includes: a first ground line GDL1 and a second ground line GDL2 located in the peripheral area WA. One end of the first ground line GDL1 is connected to a corresponding pad PAD in the pad area BA, and the other end of the first ground line GDL1 extends to a side of the display area DA away from the pad area BA. One end of the second ground line GDL2 is connected to a corresponding pad PAD in the pad area BA, and the other end of the second ground line GDL2 extends to the side of the display area DA away from the pad area BA. The first ground line GDL1 and the second ground line GDL2 form a semi-enclosed structure surrounding the display area DA, and each touch signal line TL is located between the first ground line GDL1 and the second ground line GDL2. Both the pad PAD connected to the first ground line GDL1 and the pad PAD connected to the second ground line GDL2 are configured to load a ground signal. Specifically, both the pad PAD connected to the first ground line GDL1 and the pad PAD connected to the second ground line GDL2 are connected to a ground terminal on the touch driving chip, so as to prevent the touch electrode pattern and the touch signal line TL from being interfered by external static electricity or other interference. The end of the first ground line GDL1 not connected to the pad PAD and the end of the second ground line GDL2 not connected to the pad PAD are arranged at an interval.

For example, the first ground line GDL1 includes a first ground portion located on the side of the display area DA away from the pad area BA, that is, the first ground portion is a portion of the first ground line GDL1 located above the display area DA in FIG. 2. The second ground line GDL2 includes a second ground portion located on the side of the display area DA away from the pad area BA, that is, the second ground portion is a portion of the second ground line GDL2 located above the display area DA in FIG. 2. The first ground portion is not in contact with the second ground portion, and the first ground portion overlaps the second ground portion in a first direction, which is a direction from the pad area BA to the display area DA (i.e., a direction from bottom to top in FIG. 2). That is, a portion of the second ground portion is located above the first ground portion.

In some embodiments, as shown in FIG. 2 and FIG. 4, the touch structure 40 further includes: a first guard line Guard1 and a second guard line Guard2. One end of the first guard line Guard1 is connected to a corresponding pad in the pad area BA, and the other end of the first guard line Guard1 extends to the side of the display area DA away from the pad area BA. One end of the second guard line Guard2 is connected to a corresponding pad in the pad area BA, and the other end of the second guard line Guard2 extends to the side of the display area DA away from the pad area BA. The first guard line Guard1 and the second guard line Guard2 form a semi-enclosed structure surrounding the display area DA, the first guard line Guard1 is located between a touch signal line TL closest to the first ground line GDL1 and the first ground line GDL1, and the second guard line Guard2 is located between a touch signal line TL closest to the second ground line GDL2 and the second ground line GDL2. Both the pad PAD connected to the first guard line Guard1 and the pad PAD connected to the second guard line Guard2 are configured to load an alternating current signal, and the alternating current signal may be set by the touch driving chip according to the touch driving signal, so as to prevent the signal on the touch signal line TL from being interfered.

For example, the first guard line Guard1 includes a first guard portion located on the side of the display area DA away from the pad area BA, that is, the first guard portion is a portion of the first guard line Guard1 located above the display area DA in FIG. 2. The second guard line Guard2 includes a second guard portion located on the side of the display area DA away from the pad area BA, that is, the second guard portion is a portion of the second guard line Guard2 located above the display area DA in FIG. 2. The first guard portion is not in contact with the second guard portion, and the first guard portion does not overlap the second guard portion in a first direction, which is the direction from the pad area BA to the display area DA (i.e., a direction from bottom to top in FIG. 2).

In some embodiments, the substrate SUB is a flexible substrate SUB, which may be made of a flexible organic material, thereby facilitating the bending of the display panel. For example, the organic material is a resin material such as polyimide, polycarbonate, polyacrylate, polyetherimide, polyethersulfone, polyethylene terephthalate, polyethylene naphthalate, or the like.

As shown in FIG. 3 and FIG. 5, a first buffer layer BFL1 is disposed on the substrate SUB and configured to prevent or reduce diffusion of metal atoms and/or impurities from the substrate SUB into an active layer of a transistor. For example, a material of the first buffer layer BFL1 may include an inorganic material such as silicon oxide (SiOx), silicon nitride (SiNx), and/or silicon oxynitride (SiON), and may be formed as multiple layers or a single layer.

A semiconductor layer is disposed on the first buffer layer BFL1. A material of the semiconductor layer may include, for example, an inorganic semiconductor material (e.g., polycrystalline silicon, amorphous silicon, or the like), an organic semiconductor material, and an oxide semiconductor material. The semiconductor layer includes an active layer 51 of each transistor 50, the active layer 51 includes a channel portion and a source bridge portion and a drain bridge portion located on two sides of the channel portion, the source bridge portion is connected to a source 53 of the transistor 50, and the drain bridge portion is connected to a drain 54 of the transistor 50. Both the source bridge portion and the drain bridge portion may be doped with impurities (e.g., N-type impurities or P-type impurities) having a higher concentration than that of the impurities of the channel portion. The channel portion is directly opposite to a gate 52 of the transistor 50, and when a voltage signal applied to the gate 52 reaches a certain value, a carrier path is formed in the channel portion, so that the source 53 and the drain 54 of the transistor 50 are turned on.

A first gate insulating layer GI1 is disposed on the semiconductor layer, and a material of the first gate insulating layer GI1 may include a silicon compound and a metal oxide. For example, the material of the first gate insulating layer GI1 includes silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. In addition, the first gate insulating layer GI1 may be formed as a single layer or multiple layers.

A first gate electrode layer G1 is disposed on the first gate insulating layer GI1. The first gate electrode layer G1 includes the gate 52 of each transistor 50, a first electrode plate 71 of a capacitor 70, and further includes a scan line (not shown in the Figure). A material of the first gate electrode layer G1 may include, for example, a metal, a metal alloy, a metal nitride, a conductive metal oxide, a transparent conductive material, and the like. For example, the material of the first gate electrode layer G1 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), Strontium Ruthenium Oxide (SRO), zinc oxide (ZnOx), tin oxide (SnOx), indium oxide (InOx), gallium oxide (GaOx), Indium Tin Oxide (ITO), Indium Zinc Oxide (IZO), and the like. The first gate electrode layer G1 may have a single layer or multiple layers.

A second gate insulating layer GI2 is disposed on the first gate electrode layer G1, and a material of the second gate insulating layer GI2 may include, for example, a silicon compound, a metal oxide. For example, the material of the second gate insulating layer GI2 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. The second gate insulating layer GI2 may be formed as a single layer or multiple layers.

A second gate electrode layer G2 is disposed on the second gate insulating layer GI2. The second gate electrode layer G2 may include a second electrode plate 72 of the capacitor 70. A material of the second gate electrode layer G2 may include, for example, a metal, a metal alloy, a metal nitride, a conductive metal oxide, a transparent conductive material, and the like. For example, the material of the gate electrode layer may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), Strontium Ruthenium Oxide (SRO), zinc oxide (ZnOx), tin oxide (SnOx), indium oxide (InOx), gallium oxide (GaOx), Indium Tin Oxide (ITO), Indium Zinc Oxide (IZO), and the like. The second gate electrode layer G2 may have a single layer or multiple layers.

An interlayer insulating layer ILD is disposed on the second gate electrode layer G2, and a material of the interlayer insulating layer ILD may include, for example, a silicon compound, a metal oxide, and the like. Specifically, the material may be selected from the silicon compounds and metal oxides listed above, which is not repeatedly described herein.

A first source/drain conductive layer SD1 is disposed on the interlayer insulating layer ILD. The first source/drain conductive layer SD1 may include the source 53 and the drain 54 of each transistor 50 in the display area DA, the source 53 is electrically connected to the source bridge portion, and the drain 54 is electrically connected to the drain bridge portion. A material of the first source/drain conductive layer SD1 may include a metal, an alloy, a metal nitride, a conductive metal oxide, a transparent conductive material, and the like, for example, the first source/drain conductive layer SD1 may be a single layer or multiple layers made of a metal, such as Mo/Al/Mo or Ti/Al/Ti. The transistor 50 shown in FIG. 3 and FIG. 5 includes the gate 52, the source 53, the drain 54, and the active layer 51. In addition, the first source/drain conductive layer SD1 may further include a first power supply line, a second power supply line, and a data line (not shown in the Figure). Gate lines and the data lines divide the display area into a plurality of pixel units, each pixel unit is provided with the light-emitting element and a pixel driving circuit, the pixel driving circuit includes a plurality of transistors, and the transistor shown in FIG. 3 and FIG. 5 is one of the transistors in the pixel driving circuit. The first power supply line is configured to supply a high-level signal to the pixel circuit, and the second power supply line is configured to supply a low-level signal to the light-emitting elements.

A passivation layer PVX is disposed on the first source/drain conductive layer SD1, and a material of the passivation layer PVX may include a silicon compound, such as silicon oxide, silicon nitride, or silicon oxynitride.

A first planarization layer PLN1 is disposed on a side of the passivation layer PVX away from the substrate SUB, and a surface of the first planarization layer PLN1 away from the substrate SUB is substantially flat. The first planarization layer PLN1 is made of an organic insulating material, for example, the organic insulating material includes a resin material such as polyimide, epoxy resin, acryl, polyester, photoresist, polyacrylate, polyamide, siloxane, or the like. For another example, the organic insulating material includes an elastic material, such as urethane, thermoplastic polyurethane (TPU), or the like.

A second source/drain conductive layer SD2 is disposed on a side of the first planarization layer PLN1 away from the substrate SUB. The second source/drain conductive layer SD2 may include a transfer electrode 60 located in the display area DA. The transfer electrode 60 is electrically connected to the drain 54 through penetrating via holes of the first planarization layer PLN1 and the passivation layer PVX, and in the meantime, the transfer electrode 60 is electrically connected to a first electrode 51 of the light-emitting element with a via hole penetrating the second planarization layer PLN2. The transfer electrode 60 may prevent direct formation of a via hole having a relatively large diameter in the first planarization layer PLN1 and the second planarization layer PLN2, thereby improving the quality of the electrical connection of the via hole. A material of the second source/drain conductive layer SD2 may include a metal, an alloy, a metal nitride, a conductive metal oxide, a transparent conductive material, and the like, for example, the second source/drain conductive layer SD2 may be a single layer or multiple layers made of a metal, such as Mo/Al/Mo or Ti/Al/Ti. The material of the second source/drain conductive layer SD2 may be the same as or different from that of the first source/drain conductive layer SD1.

A second planarization layer PLN2 is disposed on the second source/drain conductive layer SD2 and covers the transfer electrode 60, and an upper surface of the second planarization layer PLN2 is substantially flat. The second planarization layer PLN2 is made of an organic insulating material, for example, the organic insulating material includes a resin material such as polyimide, epoxy resin, acryl, polyester, photoresist, polyacrylate, polyamide, siloxane, or the like. For another example, the organic insulating material includes an elastic material, such as urethane, thermoplastic polyurethane (TPU), or the like. The material of the second planarization layer PLN2 may be the same as or different from that of the first planarization layer PLN1.

A pixel defining layer PDL is disposed on a side of the second planarization layer PLN2 away from the substrate SUB and includes pixel openings in one-to-one correspondence with the light-emitting elements. A material of the pixel defining layer PDL may include an organic insulating material such as polyimide, polyphthalimide, polyphthalamide, acrylic resin, benzocyclobutene, phenol resin, or the like.

A light-emitting element 11 includes a first electrode 11a, a light-emitting layer 11c, and a second electrode 11b, the first electrode 11a is located between the second planarization layer PLN2 and the pixel defining layer PDL, the light-emitting layer 11c is located in a corresponding pixel opening, and the second electrode 11b is located on a side of the light-emitting layer 11c away from the substrate. The second electrodes 11b of all the light-emitting elements 11 in the display area DA are connected as a whole to form a second electrode layer. The first electrode 11a is an anode of the light-emitting element, and the second electrode 11b is a cathode. The first electrode 11a is electrically connected to the transfer electrode 60 with a via hole penetrating the second planarization layer PLN2, and thus is electrically connected to the drain 54 of the transistor 50. The first electrode 51 may be made of, for example, a metal, a metal alloy, a metal nitride, a conductive metal oxide, a transparent conductive material, or the like. The first electrode 51 may be a single-layer or a multi-layer structure. A portion of the first electrode 51 is exposed by the pixel opening.

The material of the light-emitting layer 11c may include a small molecular organic material or a polymer molecular organic material, may be a fluorescent luminescent material or a phosphorescent luminescent material, and may emit red light, green light, blue light, or white light. The second electrode 11b is located on the side of the light-emitting layer 11c away from the substrate SUB, and the second electrode 11b may be made of a metal, a metal alloy, a metal nitride, a conductive metal oxide, a transparent conductive material, and the like. In the embodiment of the present disclosure, the light-emitting element 11 may have a top-emission type structure or a bottom-emission type structure.

When the top-emission type structure is adopted, the first electrode 11a includes a conductive material having a light reflection property or includes a light reflection film, and the second electrode 11b includes a transparent or semi-transparent conductive material. When the bottom-emission type structure is adopted, the second electrode 11b includes a conductive material having a light reflection property or includes a light reflection film, and the first electrode 11a includes a transparent or semi-transparent conductive material.

It should be noted that the light-emitting element 11 may further include other film layers, for example, the light-emitting element 11 may further include a hole injection layer and a hole transport layer located between the first electrode 11a and the light-emitting layer 11c, and an electron transport layer and an electron injection layer located between the light-emitting layer 11c and the second electrode 11b.

In some embodiments, the encapsulation layer EPL includes a first inorganic encapsulation layer CVD1, a second inorganic encapsulation layer CVD2, and an organic encapsulation layer IJP, the second inorganic encapsulation layer CVD2 is located on a side of the first inorganic encapsulation layer CVD1 away from the substrate SUB, the organic encapsulation layer IJP is located between the first inorganic encapsulation layer CVD1 and the second inorganic encapsulation layer CVD2. Both the first inorganic encapsulation layer CVD1 and the second inorganic encapsulation layer CVD2 may be made of an inorganic material with a high density, such as silicon oxynitride (SiON), silicon oxide (SiOx), and silicon nitride (SiNx). The organic encapsulation layer IJP may be made of a polymer material containing a desiccant or a polymer material capable of blocking vapor. For example, the organic encapsulation layer IJP may be made of a polymer resin, so that stress of the first inorganic encapsulation layer CVD1 and the second inorganic encapsulation layer CVD2 may be relieved, and a water-absorbing material such as a desiccant may be included to absorb substances such as water, oxygen and the like eroding into the interior.

An overlaying layer OC is disposed on a side of the touch structure 40 away from the substrate SUB. The overlaying layer OC covers the touch driving electrode TX, the touch sensing electrode RX, the touch signal line TL, the first ground line GDL1, and the second ground line GDL2. A material of the overlaying layer OC may include an inorganic insulating material or an organic insulating material.

In the embodiment of the present disclosure, the flexible substrate SUB is provided with the first gate insulating layer GI1, the second gate insulating layer GI2, and the buffer layer BFL. However, it can be understood that in some examples, these layers may be omitted or added according to actual needs, which is not specifically limited by the present disclosure.

In addition, in some examples, the second planarization layer PNL2 and the transfer electrode 60 may be omitted. In this case, the first electrode 11a is disposed directly on the first planarization layer PNL1, and is electrically connected to the drain 54 through the via hole in the PNL1.

Figure 6:
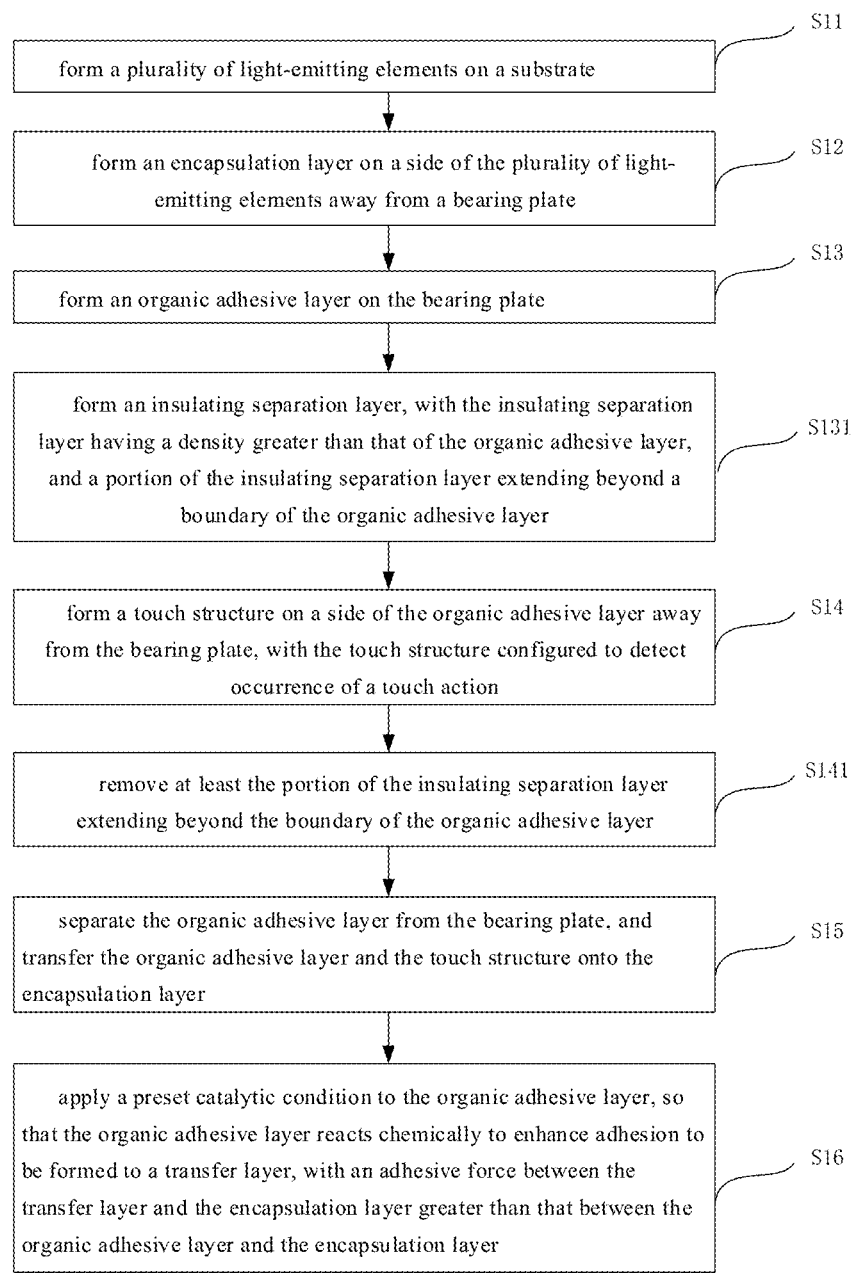
FIG. 6 is a flowchart illustrating a method for manufacturing a display panel according to some embodiments of the present disclosure.

An embodiment of the present disclosure further provides a method for manufacturing the display panel, and FIG. 6 is a flowchart illustrating a method for manufacturing a display panel according to some embodiments of the present disclosure. As shown in FIG. 6, the manufacturing method includes the following steps.

At step S11, a plurality of light-emitting elements are formed on a substrate.

At step S12, an encapsulation layer is formed on a side of the plurality of light-emitting elements away from the substrate.

At step S13, an organic adhesive layer is formed on a bearing plate.

At step S14, a touch structure is formed on a side of the organic adhesive layer away from the bearing plate and is configured to detect occurrence of a touch action.

At step S15, the organic adhesive layer is separated from the bearing plate, and the organic adhesive layer and the touch structure are transferred onto the encapsulation layer.

At step S16, a preset catalytic condition is applied to the organic adhesive layer, so that the organic adhesive layer reacts chemically to enhance adhesion and thus to be formed to a transfer layer, and an adhesive force between the transfer layer and the encapsulation layer is greater than that between the organic adhesive layer and the encapsulation layer.

In the embodiment of the present disclosure, the touch structure is directly manufactured on the encapsulation layer, so that an etching process and a high-temperature annealing process of the touch structure do not cause damage to the encapsulation layer and films between the encapsulation layer and the substrate, thereby facilitating the improvement of product yield of the display panel.

It should be noted that, in the embodiment of the present disclosure, the sequence of the step S13 and the steps S11 and S12 is not particularly limited, and the step S13 may be performed before the steps S11 to S12, or may be performed after the steps S11 to S12.

In some embodiments, the preset catalytic condition includes a photo-curing (e.g., ultraviolet curing) condition or a moisture curing condition.

In some embodiments, the bearing plate is made of a material with high strength and high temperature resistance, for example, the bearing plate is a glass substrate.

In some embodiments, between the steps S13 and S14, the manufacturing method further includes: a step S131, at which an insulating separation layer is formed and has a density greater than that of the organic adhesive layer, and a portion of the insulating separation layer extends beyond a boundary of the organic adhesive layer, so that the portion of the insulating separation layer extending beyond the boundary of the organic adhesive layer is connected to the bearing plate, such that the insulating separation layer and the organic adhesive layer are stably fixed on the bearing plate, thereby facilitating the formation of the touch structure.

In some embodiments, the insulating separation layer includes a lamination of one or more of a nitride layer of silicon, an oxide layer of silicon, and an oxynitride layer of silicon. For example, the insulating separation layer is formed by plasma enhanced chemical vapor deposition (PECVD).

Between the steps S14 and S15, the manufacturing method further includes: a step S141, at which at least the portion of the insulating separation layer extending beyond the boundary of the organic adhesive layer is removed, so as to separate the organic adhesive layer from the bearing plate. In some embodiments, the step S141 specifically includes cutting the insulating separation layer and the organic adhesive layer along a preset cutting line, and the cutting line is located on an inner side of the boundary of the organic adhesive layer.

FIG. 7A to FIG. 7M are schematic diagrams illustrating a process of a method for manufacturing a display panel according to some embodiments of the present disclosure.

As shown in FIG. 7A to FIG. 7M, the method for manufacturing the display panel includes the following steps.

Figure 7A:
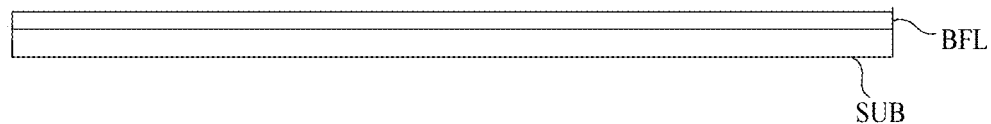
FIG. 7A to FIG. 7M are schematic diagrams illustrating a process of a method for manufacturing a display panel according to some embodiments of the present disclosure.

At step S21a, a buffer layer BFL is formed on a substrate, as shown in FIG. 7A.

Figure 7B:
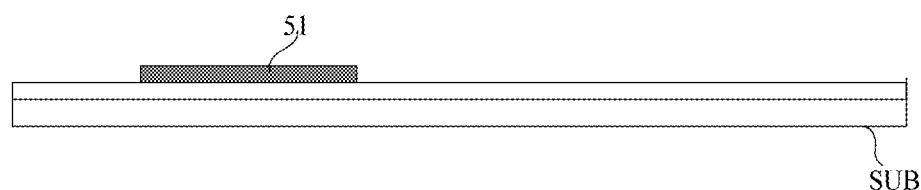

At step S21b, as shown in FIG. 7B, a semiconductor layer is formed on a side of the buffer layer BFL away from the substrate SUB. The semiconductor layer includes an active layer 51 of each transistor, and the active layer 51 includes a channel portion and a source bridge portion and a drain bridge portion located on two sides of the channel portion.

In some embodiments, the semiconductor layer is formed by sputtering, thermal evaporation, plasma enhanced chemical vapor deposition (PECVD), low pressure chemical vapor deposition (LPCVD), atmospheric pressure chemical vapor deposition (APCVD), or electron cyclotron resonance chemical vapor deposition (ECR-CVD).

Figure 7C:
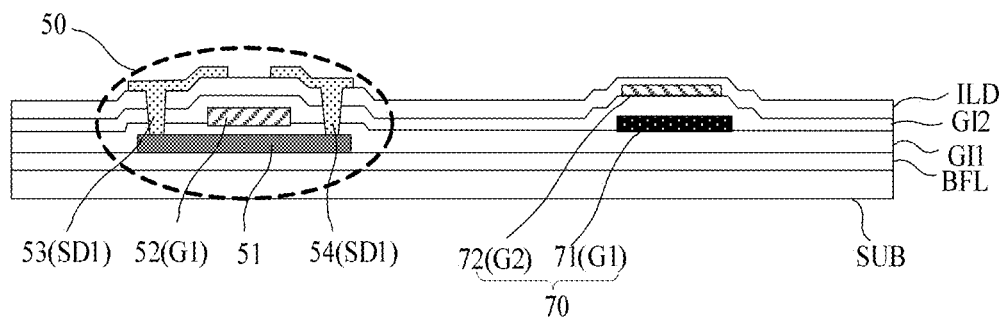

At step S21c, as shown in FIG. 7C, then, a first gate insulating layer GI1 is formed on a side of the semiconductor layer away from the substrate SUB; then, a first gate electrode layer G1 is formed on a side of the first gate insulating layer GI1 away from the substrate SUB; then, a second gate insulating layer GI2 is formed on a side of the first gate electrode layer G1 away from the substrate SUB; then, a second gate electrode layer G2 is formed on a side of the second gate insulating layer GI2 away from the substrate SUB; then, an interlayer insulating layer ILD is formed on a side of the second gate electrode layer G2 away from the substrate SUB; and then, a first source/drain conductive layer SD1 is formed on a side of the interlayer insulating layer ILD away from the substrate SUB.

The first gate electrode layer G1 includes a gate 52 of each transistor 50 and a first electrode plate 71 of a capacitor 70. The second gate electrode layer may include a second electrode plate 72 of the capacitor 70.

Reference is made to the above description for the materials of the first gate insulating layer GI1, the first gate electrode layer G1, the second gate insulating layer GI2, the second gate electrode layer G2, the interlayer insulating layer ILD, and the first source/drain conductive layer SD1, which is not repeatedly described herein. In some embodiments, the first gate electrode layer G1, the second gate electrode layer G2, and the first source/drain conductive layer SD1 are formed by a physical vapor deposition method such as magnetron sputtering. The first gate insulating layer, the second gate insulating layer GI2, and the interlayer insulating layer ILD are formed by PECVD. The first source/drain conductive layer SD1 may include a source 53 and a drain 54 of each transistor in a display region, the source 53 is connected to the source bridge portion of the active layer 51 through the via hole penetrating the interlayer insulating layer ILD, the second gate insulating layer GI2 and the first gate insulating layer GI1, and the drain 54 is connected to the drain bridge portion of the active layer 51 through the via hole penetrating the interlayer insulating layer ILD, the second gate insulating layer GI2 and the first gate insulating layer GI1.

Figure 7D:
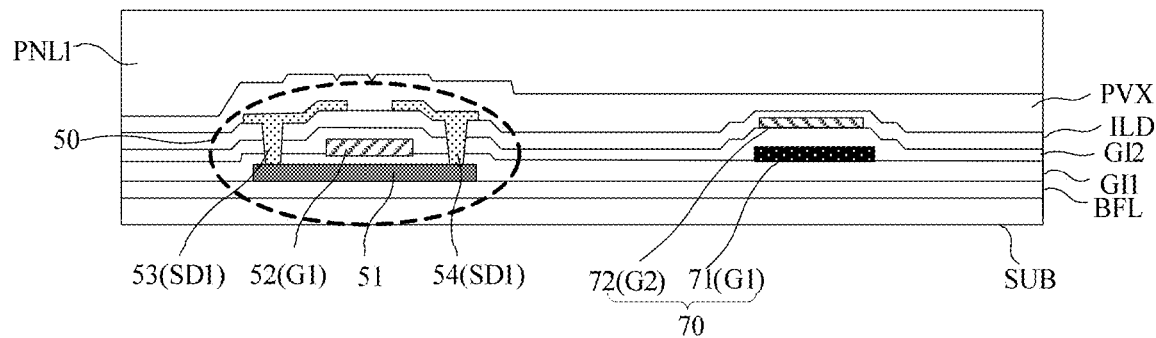

At step S21d, as shown in FIG. 7D, a passivation layer PVX is formed on a side of the first source/drain conductive layer SD1 away from the substrate SUB, and then a first planarization layer PLN1 is formed.

Figure 7E:
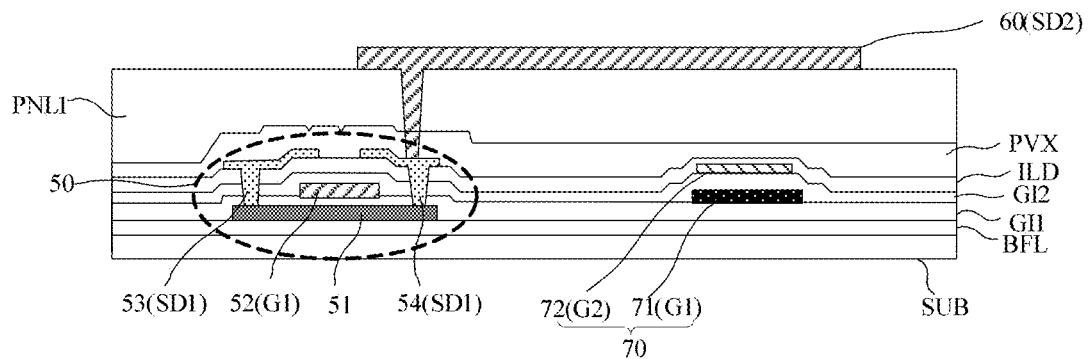

At step S21e, as shown in FIG. 7E, a second source/drain conductive layer SD2 is formed on a side of the first planarization layer PLN1 away from the substrate SUB. The second source/drain conductive layer SD2 includes a transfer electrode 60, and the transfer electrode 60 is electrically connected to the drain 54 through a via hole penetrating the first planarization layer PLN1 and the passivation layer PVX. Reference is made to the above description for a material of the second source/drain conductive layer SD2, which is not repeatedly described herein.

Figure 7F:
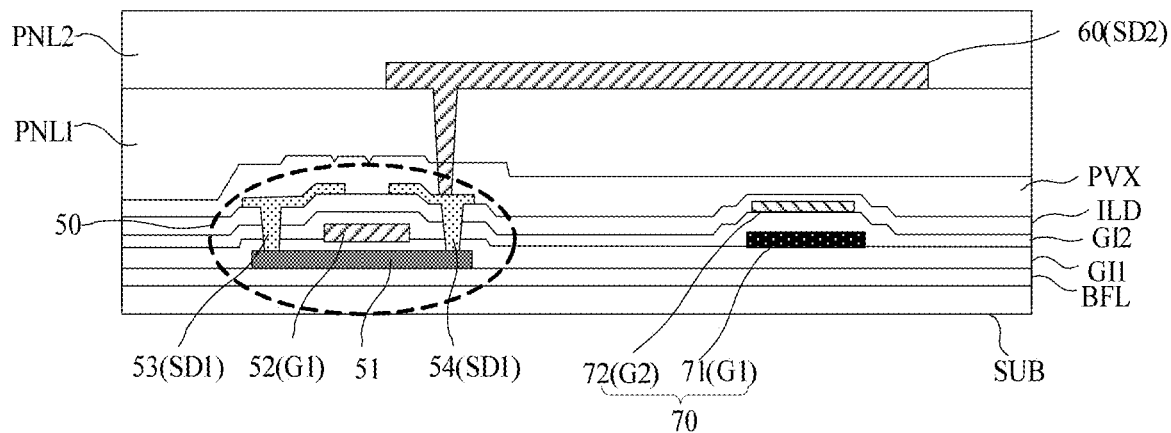

At step S21f, as shown in FIG. 7F, a second planarization layer PLN2 is formed on a side of the second source/drain conductive layer SD2 away from the substrate SUB.

Figure 7G:
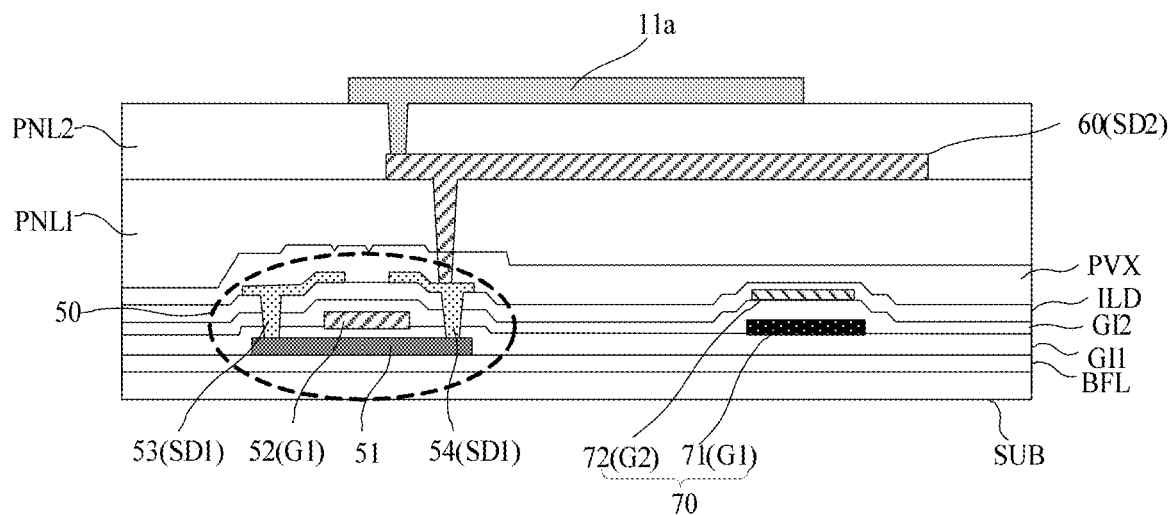

At step S21g, as shown in FIG. 7G, a first electrode 11a of each of a plurality of light-emitting elements is formed. The first electrode 11a is connected to the transfer electrode 60 through a via hole in the second planarization layer PLN2.

Figure 7H:
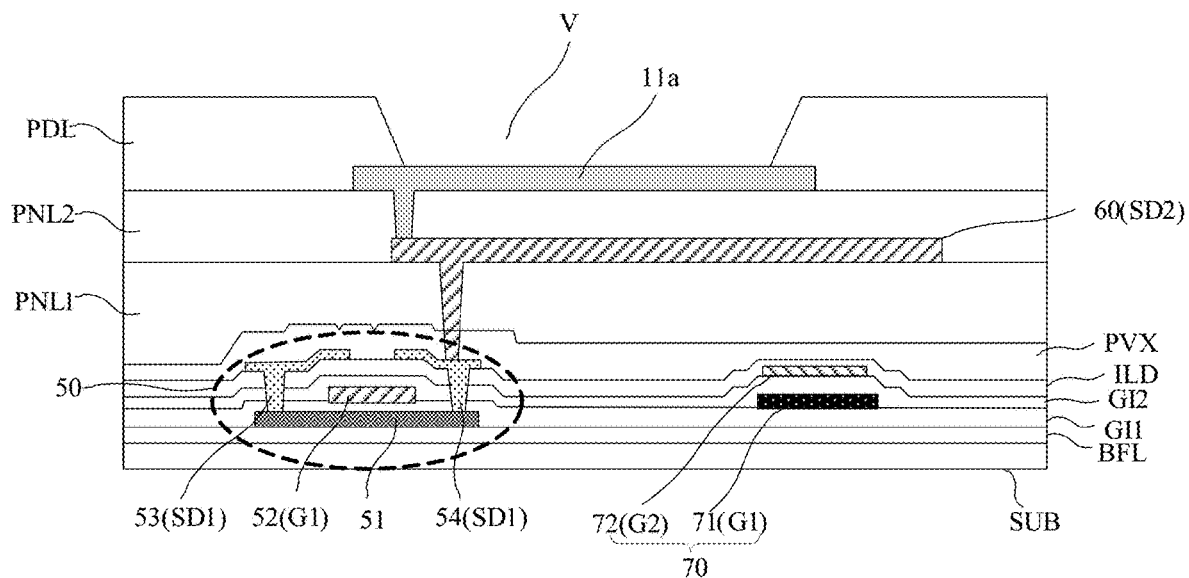

At step S21h, as shown in FIG. 7H, a pixel defining layer PDL is formed on a side of the second planarization layer PLN2 away from the substrate SUB and includes pixel openings V in one-to-one correspondence with the light-emitting elements. The first electrode 11a of the light-emitting element is located between the second planarization layer PLN2 and the pixel defining layer PDL, and a portion of the first electrode 11a is exposed by a corresponding pixel opening V.

Figure 7I:
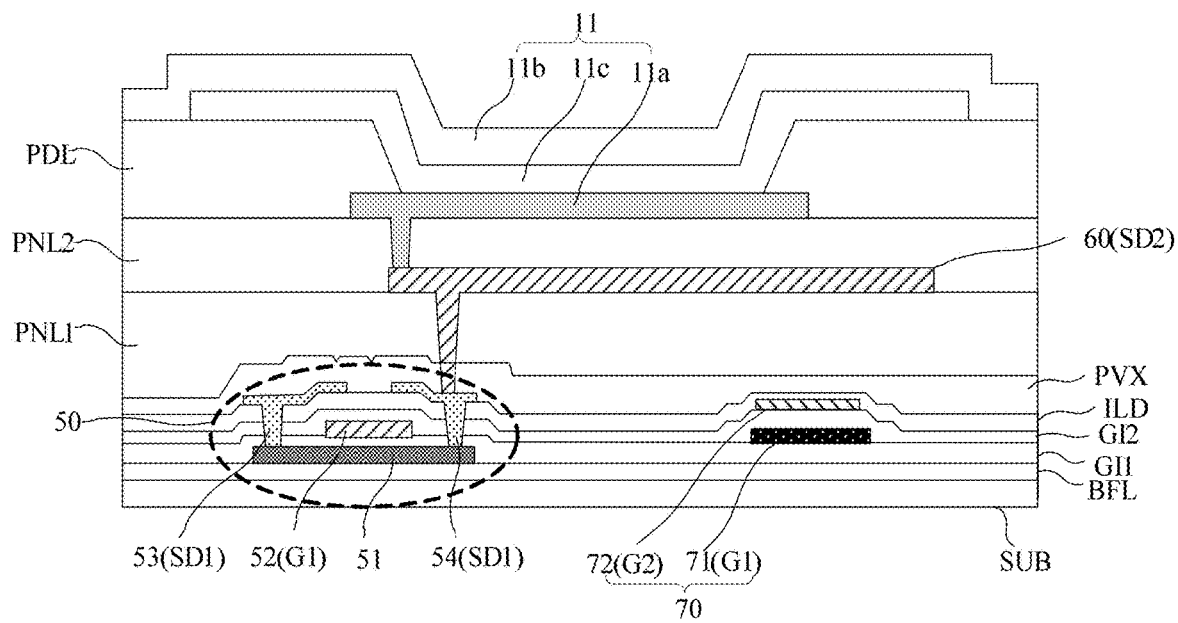

At step S21i, as shown in FIG. 7I, a light-emitting layer 11c of each of the plurality of light-emitting elements 11 is formed, and the light-emitting layer 11c is located on a side of the first electrode 11a away from the substrate SUB and is located in a corresponding pixel opening. The light-emitting layer 11c may be formed by evaporation. Then, a second electrode 11b of each of the plurality of light-emitting elements 11 is formed, and the second electrodes 11b of the plurality of light-emitting elements 11 are connected as a whole to form a second electrode layer.

The step of forming the plurality of light-emitting elements includes the above steps S21g and S21i.

The second source/drain conductive layer SD2, the first electrode 11a, and the second electrode 11b may be formed by a physical vapor deposition method such as magnetron sputtering. The first planarization layer PLN1, the second planarization layer PLN2, and the pixel defining layer PDL may be formed by inkjet printing.

Figure 7J:
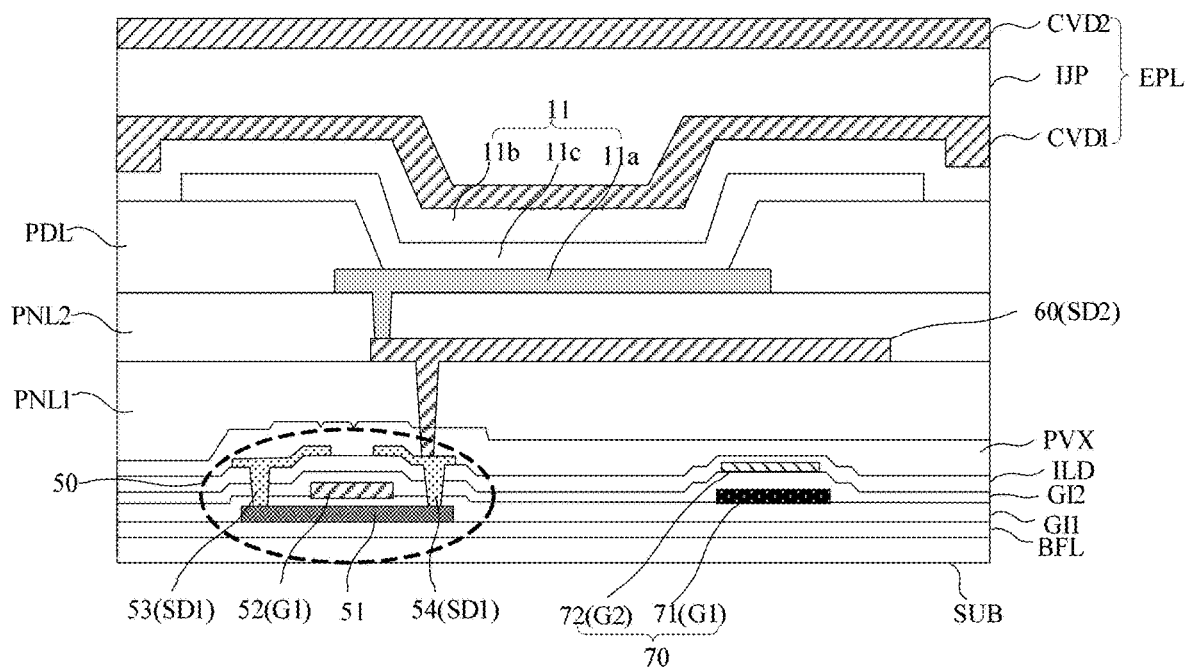

At step S22, as shown in FIG. 7J, an encapsulation layer EPL is formed on a side of the plurality of light-emitting elements 11 away from the substrate SUB. The encapsulation layer EPL includes a first inorganic encapsulation layer CVD1, a second inorganic encapsulation layer CVD2, and an organic encapsulation layer IJP located between the first inorganic encapsulation layer CVD1 and the second inorganic encapsulation layer CVD2.

Figure 7K:
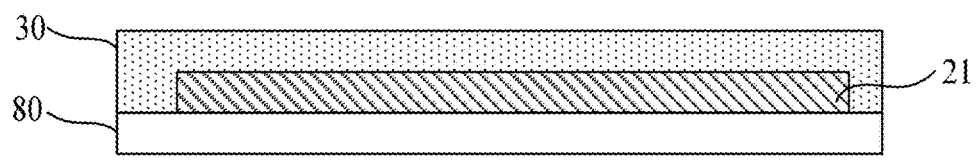

At step S23, as shown in FIG. 7K, an organic adhesive layer 21 and an insulating separation layer 30 are sequentially formed on a bearing plate 80, the insulating separation layer 30 has a density greater than that of the organic adhesive layer 21, and a portion of the insulating separation layer 30 extends beyond a boundary of the organic adhesive layer 21, so that the portion of the insulating separation layer 30 extending beyond the boundary of the organic adhesive layer 21 is connected to the bearing plate 80. For example, the insulating separation layer includes a lamination of one or more of a nitride layer of silicon, an oxide layer of silicon, and an oxynitride layer of silicon.

Figure 7L:
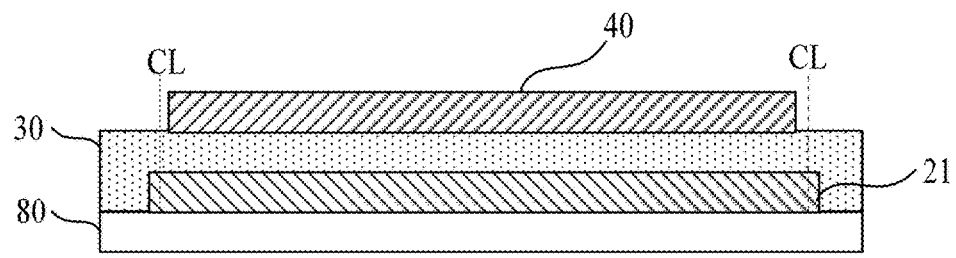

At step S24, as shown in FIG. 7L, a touch structure 40 is formed on a side of the insulating separation layer 30 away from the bearing plate 80. Specifically, the touch structure 40, as shown in FIG. 2 and FIG. 4, includes a pad PAD, a touch electrode pattern (i.e., a touch driving electrode TX and a touch sensing electrode RX), a touch signal line TL, and a touch insulating layer TLD. Accordingly, the step S24 includes forming the pad PAD, the touch electrode pattern, and the touch signal line TL on a side of the insulating separation layer 30 away from the bearing plate 80. The pad PAD is located at a position of the organic adhesive layer 21 corresponding to a pad area PAD; one end of each of a plurality of touch signal lines TL is connected to the touch electrode pattern, and the other end of each touch signal line TL is connected to a pad PAD. Furthermore, specifically, the touch electrode pattern includes a plurality of touch driving electrodes TX and a plurality of touch sensing electrodes RX, and the touch driving electrodes TX and the touch sensing electrodes RX are arranged crosswise and are insulated and separated. Each touch driving electrode TX and each touch sensing electrode RX are correspondingly connected to at least one touch signal line TL. The step S24 further includes forming the touch insulating layer TLD in FIG. 2 or FIG. 5, and a position where the touch driving electrodes TX cross the touch sensing electrodes RX are insulated and separated by the touch insulating layer TLD.

In some embodiment, as shown in FIG. 5, the touch driving electrodes TX and the touch sensing electrodes RX are located in different layers.

In other embodiments, as shown in FIG. 3, the touch driving electrode TX includes: a plurality of driving electrode units TX1 arranged in a first direction, and a bridge portion TX2 connected between each two adjacent driving electrode units TX1. The touch sensing electrode RX includes: a plurality of sensing electrode units RX1 arranged in a second direction, and a connection portion RX2 connected between each two adjacent sensing electrode units RX1. The first direction intersects the second direction, both the driving electrode units TX and the touch sensing electrode RX are located between the touch insulating layer TLD and the encapsulation layer EPL, and the bridge portion TX2 is located between the touch insulating layer TLD and the encapsulation layer EPL, that is, the driving electrode unit TX1 is formed prior to the bridge portion TX2.

In addition, in some embodiments, the step S25 further includes forming a first ground line and a second ground line. The positions and the connection relationship of the first ground line and the second ground line are shown in FIG. 3 and FIG. 5, one end of the first ground line GDL1 is connected to a corresponding pad PAD, and the other end of the first ground line GDL1 extends to a side of the touch electrode pattern away from a pad area BA; one end of the second ground line GDL2 is connected to a corresponding pad PAD, and the other end of the second ground line GDL2 extends to the side of the touch electrode pattern away from the pad area BA; and the first ground line GDL1 and the second ground line GDL2 form a semi-enclosed structure surrounding the touch electrode pattern, and each touch signal line TL is located between the first ground line GDL1 and the second ground line GDL2.

In addition, the step S24 may further include forming a first guard line Guard1 and a second guard line Guard2. The connection relationship between the first guard line Guard1 and the second guard line Guard2 is described above and thus is not repeatedly described herein. The first guard line Guard1 and the second guard line Guard2 may be manufactured in synchronization with the first ground line GDL1 and the second ground line GDL2.

At step S25, at least the portion of the insulating separation layer TLD extending beyond the boundary of the organic adhesive layer 21 is removed. In some embodiments, as shown in FIG. 7L, the step S25 includes cutting the insulating separation layer 30 and the organic adhesive layer 21 along a preset cutting line CL, and the preset cutting line CL is located on a side of the boundary of the organic adhesive layer 21 close to a center of the organic adhesive layer.

Figure 7M:
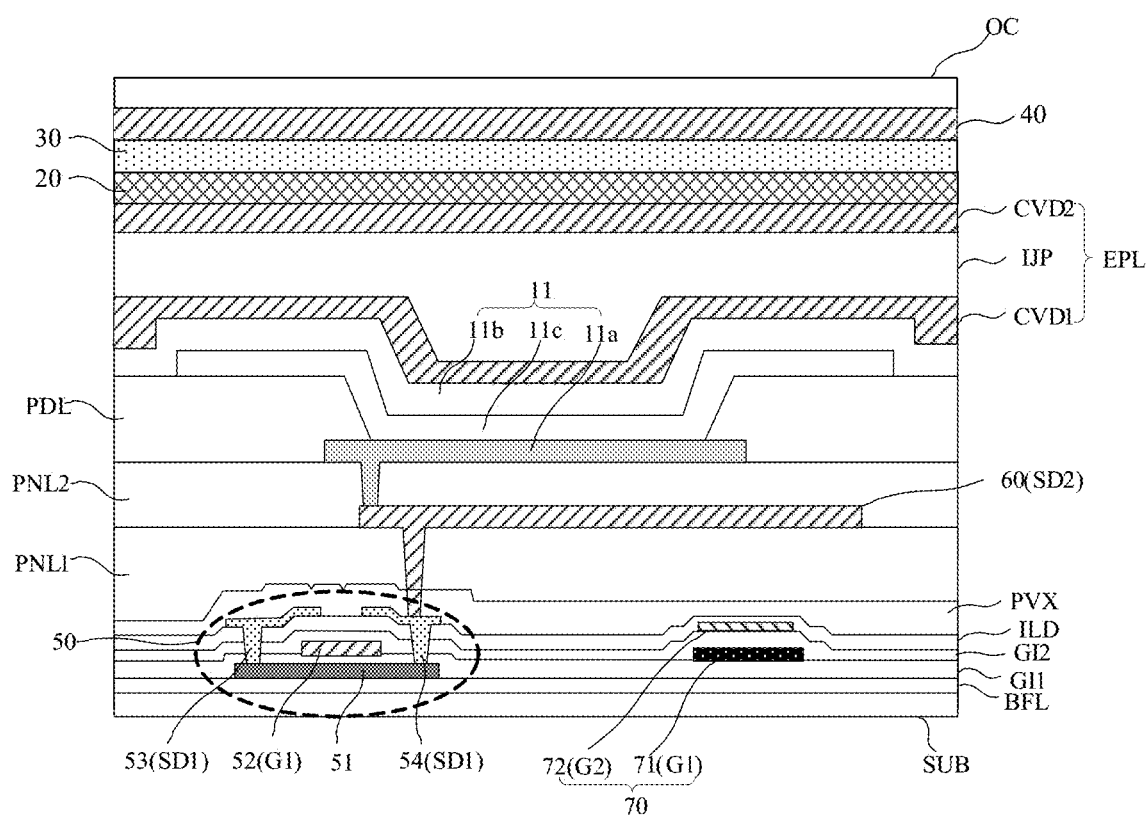

At step S26, the organic adhesive layer 21 is separated from the bearing plate 80, and the organic adhesive layer 21 and the touch structure 40 are transferred onto the encapsulation layer EPL; then, a preset catalytic condition is applied to the organic adhesive layer 21, so that the organic adhesive layer 21 reacts chemically to be formed to a transfer layer 20, and an adhesive force between the transfer layer 20 and the encapsulation layer EPL is greater than that between the organic adhesive layer 21 and the encapsulation layer EPL, as shown in FIG. 7M.

Then, an overlaying layer OC is formed. Certainly, the overlaying layer may be formed prior to step S26.

An embodiment of the present disclosure further provides a display device, including the display panel of any one of the above embodiments. The display device may be any product or component with a display function, such as an OLED panel, a mobile phone, a tablet computer, a television, a display, a laptop, a digital photo frame, a navigator and the like.

It should be understood that the above embodiments are merely exemplary embodiments that are employed to illustrate the principles of the present disclosure, and that the present disclosure is not limited thereto. Various changes and modifications can be made by those skilled in the art without departing from the spirit and essence of the present disclosure, and should be considered to fall within the protection scope of the present disclosure.

What is claimed is:

1. A display panel, comprising:
   a substrate;
   a plurality of light-emitting elements and an encapsulation layer on the substrate, wherein the plurality of light-emitting elements are between the encapsulation layer and the substrate;
   a transfer layer on a side of the encapsulation layer away from the substrate and bonded to the encapsulation layer, wherein an adhesive force between the transfer layer and the encapsulation layer is greater than that between an organic adhesive layer and the encapsulation layer, and the organic adhesive layer is configured to react chemically under a preset catalytic condition to be formed to the transfer layer; and
   a touch structure on a side of the transfer layer away from the substrate and configured to detect occurrence of a touch action,
   wherein the substrate comprises a display area and a peripheral area surrounding the display area, the peripheral area comprises a pad area on a side of the display area, and the touch structure comprises:
   a pad in the pad area,
   a touch electrode pattern,
   a touch signal line in the peripheral area, wherein one end of the touch signal line is connected to the touch electrode pattern, and the other end of the touch signal line is connected to the pad, and
   a first ground line and a second ground line in the peripheral area, wherein one end of the first ground line is coupled to a corresponding pad in the pad area, and the other end of the first ground line extends to a side of the display area away from the pad area, one end of the second ground line is coupled to a corresponding pad in the pad area, and the other end of the second ground line extends to the side of the display area away from the pad area, and the first ground line and the second ground line form a semi-enclosed structure surrounding the display area, and each touch signal line is between the first ground line and the second ground line,
   wherein the first ground line comprises a first ground portion, the second ground line comprises a second ground portion, both the first ground portion and the second ground portion are in a portion of the peripheral area, the portion of the peripheral area and the pad area being at two opposite sides of the display area, the first ground portion is not in contact with the second ground portion, and when viewed in a plan view, the first ground portion overlaps the second ground portion in a direction that is perpendicular to an extending direction of the first and second ground portions.

2. The display panel of claim 1, further comprising:
   an insulating separation layer on the side of the transfer layer away from the substrate, wherein the insulating separation layer has a density greater than that of the transfer layer, an orthographic projection of the insulating separation layer on the substrate coincides with that of the transfer layer on the substrate, and the touch structure is on a side of the insulating separation layer away from the transfer layer.

3. The display panel of claim 2, wherein the insulating separation layer comprises a lamination of one or more of a nitride layer of silicon, an oxide layer of silicon, and an oxynitride layer of silicon.

4. The display panel of claim 1, wherein the preset catalytic condition is an ultraviolet curing condition or a moisture curing condition.

5. The display panel of claim 1, wherein the touch structure further comprises a touch insulating layer, the touch electrode pattern comprises a plurality of touch driving electrodes and a plurality of touch sensing electrodes, and
   the touch driving electrodes and the touch sensing electrodes are arranged crosswise, a position where the touch driving electrodes cross the touch sensing electrodes is insulated and separated by the touch insulating layer, and each touch driving electrode and each touch sensing electrode are correspondingly connected to at least one touch signal line.

6. The display panel of claim 5, wherein the touch driving electrodes and the touch sensing electrodes are in different layers.

7. The display panel of claim 5, wherein the touch driving electrode comprises a plurality of driving electrode units arranged in a first direction, and a bridge portion connected between each two adjacent ones of driving electrode units,
   the touch sensing electrode comprises a plurality of sensing electrode units arranged in a second direction, and a connection portion connected between each two adjacent ones of the sensing electrode units, and
   the first direction intersects the second direction, all of the driving electrode units, the bridge portion and the sensing electrode units are on a side of the touch insulating layer away from the substrate and are arranged in a same layer, and the connection portion is between the touch insulating layer and the encapsulation layer.

8. The display panel of claim 1, wherein both the pad coupled to the first ground line and the pad coupled to the second ground line are configured to load a ground signal.

9. The display panel of claim 1, wherein the touch structure further comprises: a first guard line and a second guard line, one end of the first guard line is coupled to a corresponding pad in the pad area, and the other end of the first guard line extends to the side of the display area away from the pad area, one end of the second guard line is coupled to a corresponding pad in the pad area, and the other end of the second guard line extends to the side of the display area away from the pad area, and the first guard line and the second guard line form a semi-enclosed structure surrounding the display area, the first guard line is between a touch signal line closest to the first ground line and the first ground line, and the second guard line is between a touch signal line closest to the second ground line and the second ground line.

10. The display panel of claim 9, wherein both the pad coupled to the first guard line and the pad coupled to the second guard line are configured to load an alternating current signal.

11. The display panel of claim 9, wherein the first guard line comprises a first guard portion, the second guard line comprises a second guard portion, both the first guard portion and the second guard portion are on the side of the display area away from the pad area, and the first guard portion is not in contact with the second guard portion, the first guard portion does not overlap the second guard portion in a first direction that is a direction from the pad area to the display area.

12. The display panel of claim 1, further comprising:
a buffer layer on the substrate;
a semiconductor layer on a side of the buffer layer away from the substrate;
a first gate insulating layer on a side of the semiconductor layer away from the substrate;
a first gate electrode layer on a side of the first gate insulating layer away from the substrate;
a second gate insulating layer on a side of the first gate electrode layer away from the substrate;
a second gate electrode layer on a side of the second gate insulating layer away from the substrate;
an interlayer insulating layer on a side of the second gate electrode layer away from the substrate;
a first source/drain conductive layer on a side of the interlayer insulating layer away from the substrate;
a passivation layer on a side of the first source/drain conductive layer away from the substrate;
a first planarization layer on a side of the passivation layer away from the substrate;
a second source/drain conductive layer on a side of the first planarization layer away from the substrate;
a second planarization layer on a side of the second source/drain conductive layer away from the substrate; and
a pixel defining layer on a side of the second planarization layer away from the substrate and comprising pixel openings in one-to-one correspondence with the light-emitting elements, wherein each of the plurality of light-emitting elements comprises a first electrode, a light-emitting layer and a second electrode, the first electrode is between the second planarization layer and the pixel defining layer, the light-emitting layer is on a side of the first electrode away from the substrate, the light-emitting layer is in a corresponding one of the pixel openings, the second electrode is on a side of the light-emitting layer away from the substrate, and the second electrodes of the plurality of light-emitting elements are coupled as a whole to form a second electrode layer.

13. A method for manufacturing a display panel, comprising:
forming a plurality of light-emitting elements on a substrate;
forming an encapsulation layer on a side of the plurality of light-emitting elements away from the substrate;
forming an organic adhesive layer on a bearing plate;
forming a touch structure on a side of the organic adhesive layer away from the bearing plate, wherein the touch structure is configured to detect occurrence of a touch action;
separating the organic adhesive layer from the bearing plate, and transferring the organic adhesive layer and the touch structure onto the encapsulation layer; and
applying a preset catalytic condition to the organic adhesive layer, so that the organic adhesive layer reacts chemically to enhance adhesion to be formed to a transfer layer, wherein an adhesive force between the transfer layer and the encapsulation layer is greater than that between the organic adhesive layer and the encapsulation layer, wherein between the forming the organic adhesive layer on the bearing plate and the forming the touch structure on the side of the organic adhesive layer away from the bearing plate, the method further comprises:
forming an insulating separation layer, wherein the insulating separation layer has a density greater than that of the organic adhesive layer, and a portion of the insulating separation layer extends beyond a boundary of the organic adhesive layer, so that the portion of the insulating separation layer extending beyond the boundary of the organic adhesive layer is coupled to the bearing plate, and wherein between the forming the touch structure on the side of the organic adhesive layer away from the bearing plate and the separating the organic adhesive layer from the bearing plate, the method further comprises:
removing at least the portion of the insulating separation layer extending beyond the boundary of the organic adhesive layer,
wherein the removing at least the portion of the insulating separation layer extending beyond the boundary of the organic adhesive layer comprises:
cutting the insulating separation layer and the organic adhesive layer along a preset cutting line, wherein the preset cutting line is on a side of the boundary of the organic adhesive layer close to a center of the organic adhesive layer.

14. A display device, comprising the display panel of claim 1.

* * * * *